US006636996B2

(12) United States Patent
Nowka

(10) Patent No.: US 6,636,996 B2
(45) Date of Patent: Oct. 21, 2003

(54) METHOD AND APPARATUS FOR TESTING PIPELINED DYNAMIC LOGIC

(75) Inventor: Kevin J. Nowka, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 483 days.

(21) Appl. No.: 09/730,460

(22) Filed: Dec. 5, 2000

(65) Prior Publication Data

US 2002/0069384 A1 Jun. 6, 2002

(51) Int. Cl.[7] .................. G01R 31/28; H03K 19/096
(52) U.S. Cl. .................. 714/727; 714/726; 714/736; 326/95; 326/98; 326/121; 327/200; 327/208; 327/212
(58) Field of Search ................ 714/726, 727, 714/733, 734; 326/21, 31, 33–34, 93, 95, 98, 112, 119; 327/200, 208, 212; 307/443, 452, 465, 481

(56) References Cited

U.S. PATENT DOCUMENTS

| | | | | |
|---|---|---|---|---|
| 5,329,176 A | * | 7/1994 | Miller, Jr. et al. | 307/443 |
| 5,550,487 A | * | 8/1996 | Lyon | 326/33 |
| 5,557,620 A | * | 9/1996 | Miller, Jr. et al. | 714/733 |
| 5,764,089 A | * | 6/1998 | Partovi et al. | 327/200 |
| 5,859,547 A | * | 1/1999 | Tran et al. | 326/98 |
| 5,920,575 A | * | 7/1999 | Gregor et al. | 714/726 |
| 6,075,386 A | * | 6/2000 | Naffziger | 326/98 |

* cited by examiner

Primary Examiner—Emmanuel L. Moise
(74) Attorney, Agent, or Firm—Casimer K. Salys; Bracewell & Patterson, L.L.P.

(57) ABSTRACT

A method and apparatus for testing pipelined dynamic logic makes it possible to set and retrieve values from dynamic logic pipelines that have no internal latches. A modification to the pipeline circuits and clocking circuitry enable scanning logic to set and retrieve values from the pipelined circuits.

20 Claims, 3 Drawing Sheets

METHOD AND APPARATUS FOR TESTING PIPELINED DYNAMIC LOGIC

BACKGROUND OF THE INVENTION

1. Technical Field

The present invention relates generally to boundary scan testing, and more particularly, to boundary scan testing in integrated circuits incorporating pipelined dynamic logic.

2. Description of the Related Art

Functional tests of integrated circuits and printed circuit boards are necessary to assure defect-free products. Using a low pin-count serial interface, the Joint Test Action Group (JTAG) interface provides a mechanism for testing both the internal features of an integrated circuit and the connections between two integrated circuits mounted on a printed circuit board or other substrate. The details of the JTAG interface are defined by IEEE (Institute of Electrical and Electronics Engineers) standard 1149.1—IEEE Standard Test Access Port and Boundary Scan Architecture. Latches within an integrated circuit permit a manufacturing tester to load test values and latch test results by manipulating the signals in the JTAG interface.

The market for integrated circuits requires increasing speed and functional density as requirements for computing power and storage continue to rise. A technology that has been applied in recent years to an increasing number of microprocessor and other integrated circuits, is dynamic logic, sometimes referred to as "Domino Logic Circuits". Domino logic circuits are very efficient from a device per gate standpoint. But, due to the dynamic nature of the logic (logic signals exist as pulses propagating through a dynamic logic pipeline, rather than clocked through static stages), testing of integrated circuits containing domino logic typically involves only the input and output of the domino logic blocks. Since the logic is dynamic, there is no mechanism for loading values within the domino logic circuits so that the entire logic state of an integrated circuit can be set. In a typical dynamic logic pipeline, level-sensitive scan design (LSSD) latches are inserted between groups of several levels of dynamic gates. These latches provide the ability to store data within the logic for scan testing, but at a penalty of reduced performance and increased circuit area.

In a wave pipeline, rather than relying on latches to store state, the logic state is maintained within the combinatorial logic circuits. The values that would otherwise be stored in latches are maintained on capacitive nodes within the logic circuits. Because there are no explicit static latches within the wave pipeline interior, the interior of the pipeline cannot be observed or controlled for testing purposes. Static latches could be introduced in the middle of a pipeline, but this defeats the advantages of the wave pipeline constructed solely of cascaded dynamic stages. In light of the foregoing, it would be desirable to provide a method and apparatus for testing dynamic logic pipelines that have no internal latches.

SUMMARY OF THE INVENTION

The objective of testing dynamic logic pipelines having no internal latches is accomplished by initially loading a value from a scan chain into a latch, determining whether or not the integrated circuit is transitioning from scan mode to functional mode and discharging an evaluation node within the dynamic logic. The evaluation node is discharged in conformity with the loaded value in response to determining that the integrated circuit is transitioning from scan mode to functional mode.

The above as well as additional objectives, features, and advantages of the present invention will become apparent in the following detailed written description.

DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF AN ILLUSTRATIVE EMBODIMENT

Figure 1:
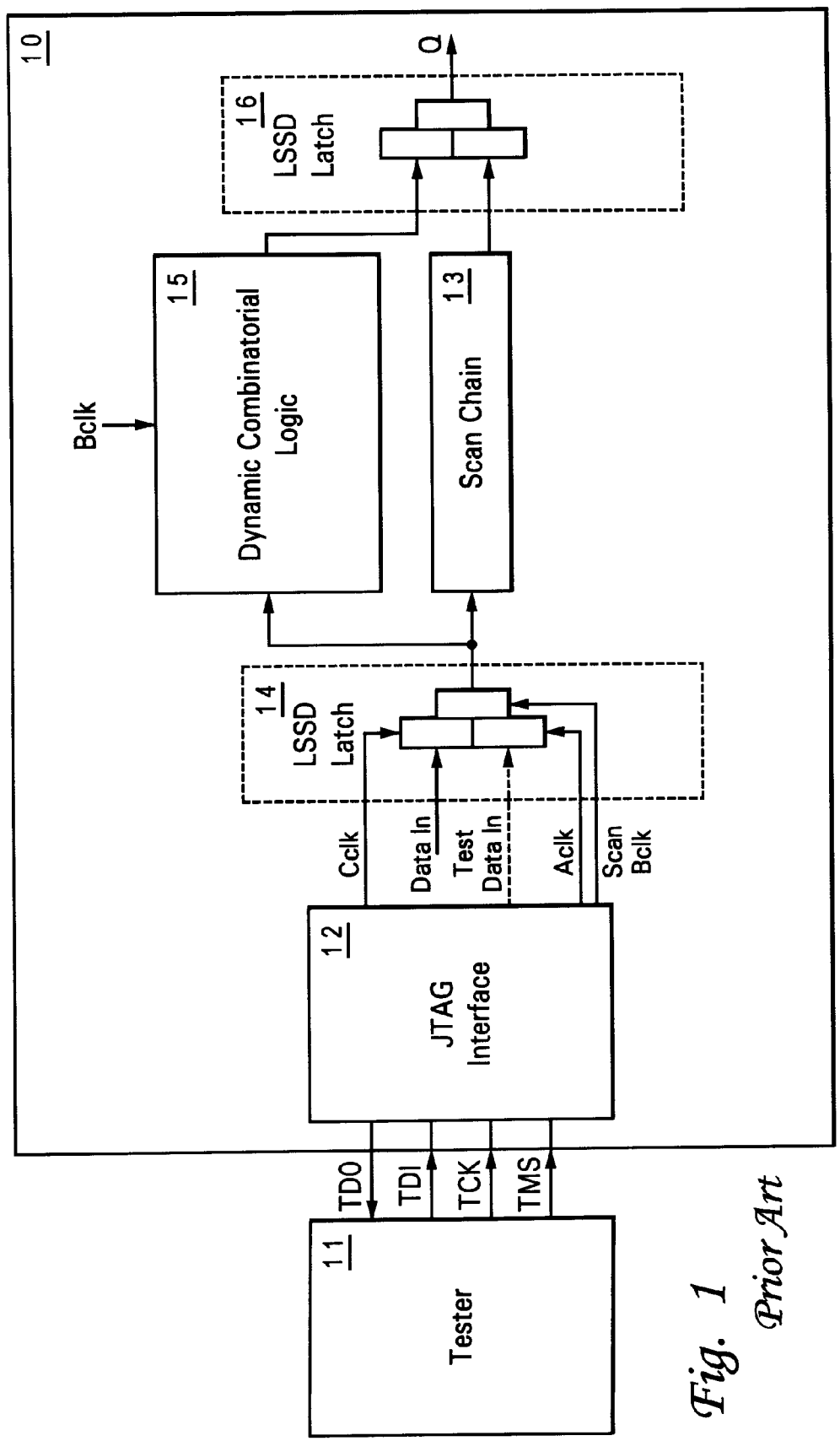
FIG. 1 is a schematic diagram of a prior art integrated circuit incorporating scan latches and dynamic logic.

With reference now to the figures, and in particular with reference to FIG. 1, there is depicted a schematic diagram of a prior art integrated circuit 10 incorporating scan latches and dynamic logic. A tester 11 is coupled to a Joint Test Action Group (JTAG) interface 12 within integrated circuit 10, which contains boundary scan circuits. JTAG interface 12 transfers data and commands between tester 11 and boundary scan blocks within integrated circuit 10, permitting values to be loaded or "scanned in" to state-storing elements within integrated circuit 10. JTAG interface 12 also enables resulting states to be read from or "scanned out" from the state-storing elements within integrated circuit 10, after clocks from tester 11 have operated integrated circuit 10 through a cycle of operation. The boundary scan blocks comprise Level-sensitive scan design (LSSD) master/slave latches 14 connected serially in LSSD scan chains 13 to load test data into combinatorial logic 15 or read data from combinatorial logic 15 that has been latched by LSSD latch 16.

LSSD scan chain 13 provides the capability to read and write the states of logic circuits within integrated circuit 10, except states that are propagating through dynamic combinatorial logic 15. Access to all of the static state-holding elements within integrated circuit 10 allows both design verification and production line testing to be performed prior to use in a computer system. LSSD scan chain 13 architectures that may be used with the techniques of the present invention are described in U.S. Pat. No. 5,920,575 entitled "VLSI Test Circuit Apparatus and Method," which is incorporated herein by reference, but other boundary scan and test port circuits and topologies may be used without departing from the spirit and scope of the invention.

The present invention provides an improved test method and apparatus that permit insertion of data within sub-networks of a dynamic pipeline.

Figure 2:
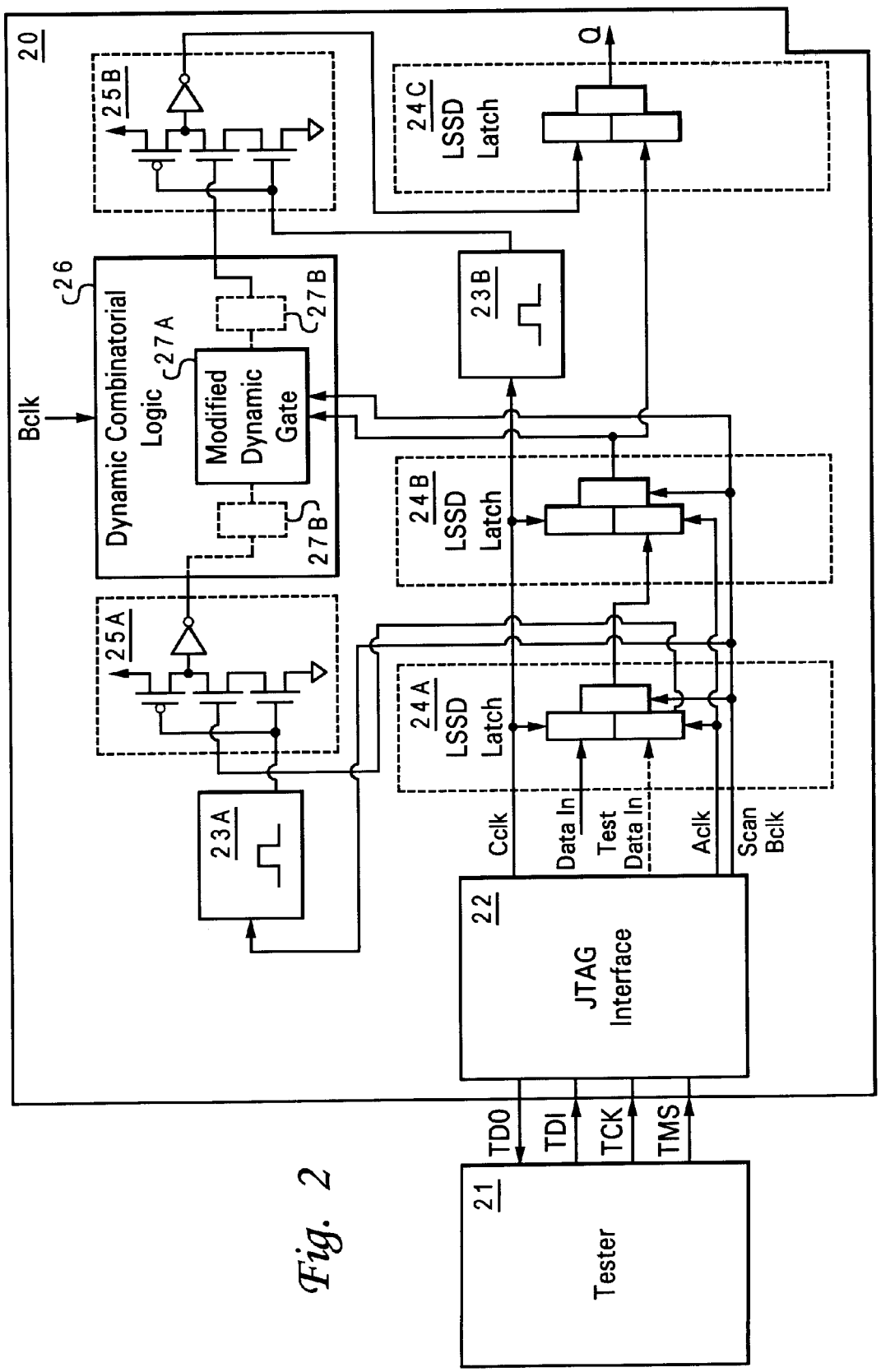
FIG. 2 is a schematic diagram of an integrated circuit incorporating scan latches and dynamic logic in accordance with a preferred embodiment of the invention.

Referring now to FIG. 2, there is depicted a schematic diagram of an integrated circuit 20 incorporating scan latches and dynamic logic in accordance with a preferred embodiment of the invention. A JTAG interface 22 is coupled to tester 21, so that the internal states of integrated circuit 20 can be set and read during manufacturing test. An LSSD latch 24A provides data to a dynamic buffer circuit 25A, which produces a pulse input to a first pipeline stage in dynamic combinatorial logic 26. Dynamic combinatorial logic 26 contains a pipeline constructed from cascaded dynamic logic gates 27B and modified dynamic gate 27A. The input scan value for the first stage in the pipeline is latched in LSSD latch 24A by an Aclk signal. A Scan Bclk signal is coupled to one-shot 23A to provide a clock pulse to launch the scan value into the pipeline. Because one shot 23A output is coupled to both the foot device and the precharge device within dynamic buffer 25A, the output of dynamic buffer 25A will be a pulse, just as the input of dynamic combinatorial logic 26 would be pulsed in normal operation. The Scan Bclk signal is the clock used to load values into the scan latches during scan mode to functional mode transition. Dynamic buffer 25A provides the data pulse to dynamic combinatorial logic 26.

A second LSSD latch 24B, latches input scan values for intermediate stages in the pipeline. Modified dynamic logic gate 27A is the mechanism whereby intermediate values are introduced. The Scan Bclk signal is used to load the scan value from LSSD latch 24B into modified dynamic logic gate 27A. The end of the dynamic logic pipeline is sampled by dynamic buffer 25B, which is clocked by a pulse generated by one-shot 23B from the Cclk signal, which is the clock used to load values into the scan latches at the end of a test clock cycle. The resultant value from dynamic buffer 25B is latched into the scan chain by LSSD latch 24C, which forms part of the scan chain coupled to JTAG interface 22. The resulting state at LSSD latch 24C can then be read out of the scan chain by serial shifting to JTAG interface 22.

Figure 3:
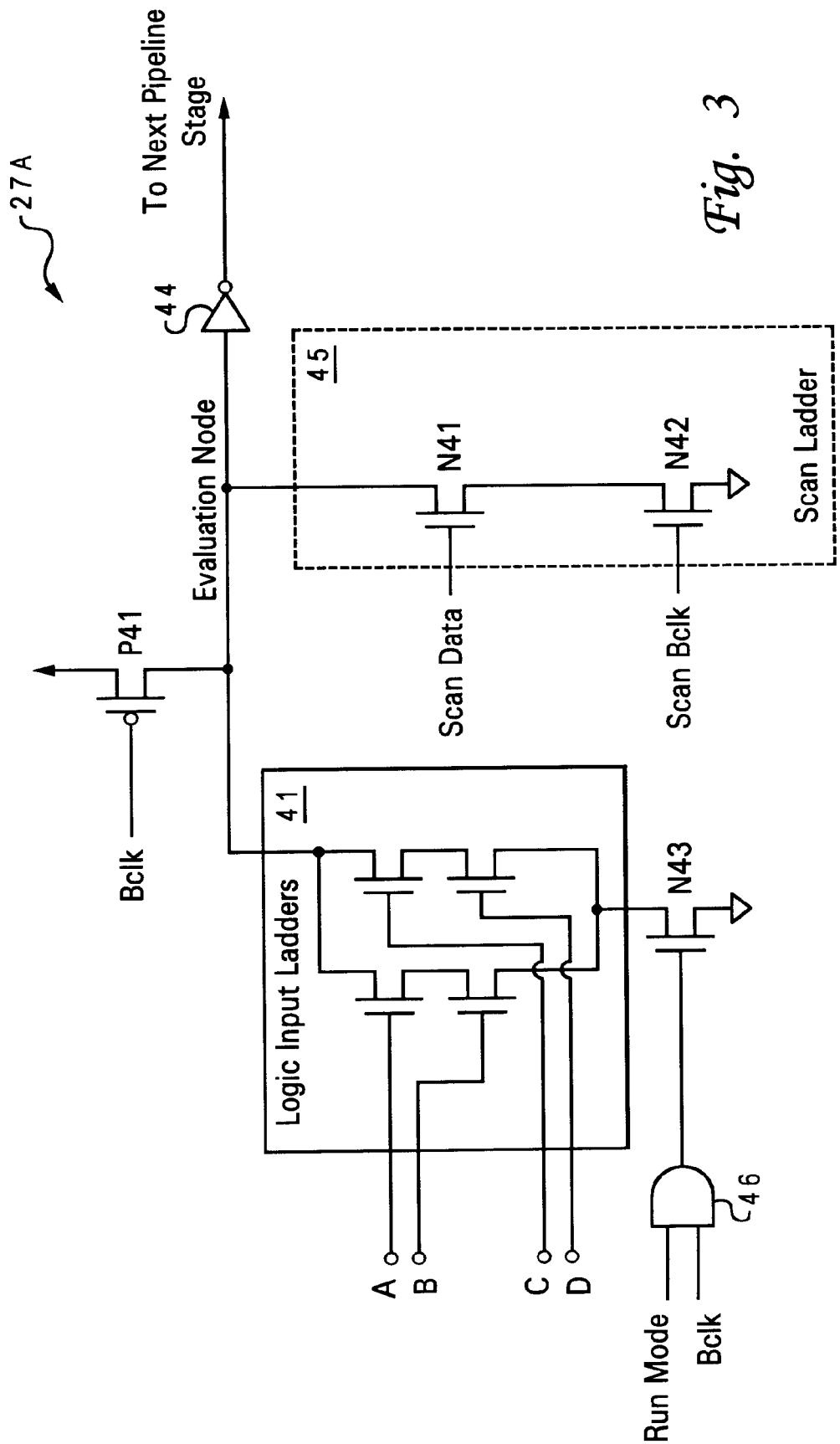
FIG. 3 is a schematic diagram of the modified dynamic logic gate within integrated circuit 20 of FIG. 2 in accordance with a preferred embodiment of the invention.

Referring now to FIG. 3, a schematic diagram of modified dynamic gate 27A from FIG. 2 is depicted. Logic input ladders 41 provide the functional operation of modified dynamic gate 27A. For example, a logic input ladder 41 as depicted implements the logic function: (A and B) or (C and D). The actual effect on the evaluation node is the inverse of this equation, but inverter 44 inverts the value of the evaluation node to generate the output value from the logic gate. Since the evaluation node will be discharged if either of signal pairs (A,B) or (C,D) are (1,1) (logic high states), the evaluation node represents a logical NAND of the input values when a foot transistor N43 is activated after the Bclk signal has precharged the evaluation node.

Scan ladder 45 is used to introduce an input scan data value to modified dynamic logic gate 27A. A transistor N41 is enabled to discharge the evaluation node if the Scan Bclk signal is in a logic high state. Since the Scan Bclk signal is only active during scan mode, scan ladder 45 does not affect the normal functional operation of integrated circuit 20. Logic input ladders 41 are prevented from affecting the scan value loaded during test by foot transistor N43. An AND gate 46 or other means for gating the Bclk signal provides a bclk signal that is valid only during run mode. Run mode is an operational mode as opposed to tester scan mode. This prevents interference with the loading of values via scan ladder 45 while integrated circuit 20 is in scan mode. AND gate 43 prevents the Bclk signal from turning on foot transistor N43, effectively removing logic input ladders 41 from dynamic logic gate 27A during scan mode.

Preset transistor P41 is clocked by the Bclk signal so that the evaluation node is preset for both scan mode and run mode. The preset voltage will be selectively discharged by logic input ladders 41, or scan ladder 45, depending on the mode of integrated circuit 20 as set by tester 21. The output value is presented to the next stage in the dynamic pipeline, which may or may not have a scan ladder coupled to its evaluation node, depending on testability requirements for integrated circuit 20.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. An integrated circuit comprising:
   a tester interface;
   a dynamic logic pipeline;
   an input scan latch coupled to said tester interface configured to hold a value loadable into a dynamic logic gate within said dynamic logic pipeline; and
   a scan ladder coupled to an evaluation node of said dynamic logic gate and further coupled to a load clock of said tester interface, such that said scan ladder may discharge said evaluation node in conformity with said value.

2. The integrated circuit of claim 1, wherein said scan ladder comprises a first transistor having a gate coupled to an output of said input scan latch and a first channel connection coupled to said evaluation node.

3. The integrated circuit of claim 2, wherein said scan ladder further comprises a second transistor having a gate coupled to said load clock, a first channel connection coupled to a second channel connection of said first transistor and a second channel connection coupled to a power supply rail.

4. The integrated circuit of claim 1, further comprising:
   an output scan latch for latching a result of the propagation of said value through said dynamic logic pipeline; and
   a dynamic inverter having an input coupled to an output of said dynamic logic pipeline and a clock input for presetting said dynamic inverter.

5. The integrated circuit of claim 4, further comprising a delayed one-shot circuit for clocking said clock input of said dynamic inverter, wherein said delayed one-shot is coupled to a stop control output of said tester interface for latching said result.

6. The integrated circuit of claim 5, further comprising:
   an input scan latch for latching a second value for loading into a first stage of said dynamic logic pipeline; and
   a dynamic inverter having an input coupled to an output of said input scan latch and a clock input for presetting said dynamic inverter.

7. The integrated circuit of claim 6, further comprising a delayed one-shot circuit for clocking said clock input of said dynamic inverter, wherein said delayed one-shot is coupled to said load clock for clocking said second value into said first stage of said dynamic pipeline.

8. The integrated circuit of claim 1, further comprising:
   an input scan latch for latching a second value for loading into a first stage of said dynamic logic pipeline; and
   a dynamic inverter having an input coupled to an output of said input scan latch and a clock input for presetting said dynamic inverter.

9. The integrated circuit of claim 8, further comprising a delayed one-shot circuit for clocking said clock input of said dynamic inverter, wherein said delayed one-shot is coupled to said load clock for clocking said second value into said first stage of said dynamic pipeline.

10. A dynamic logic gate, comprising:

a preset device coupled to an evaluation node of said dynamic logic gate for charging said evaluation node to a preset state;

a logic input ladder coupled to said evaluation node for discharging said evaluation node in conformity with a state of logic inputs; and a scan ladder coupled to said evaluation node, said scan ladder having an input for coupling a load clock for testing said dynamic logic gate.

11. The dynamic logic gate of claim 10, wherein said logic input ladder comprises a functional foot device coupled to a functional logic clock for enabling said logic input ladder when said dynamic logic gate is operated in a functional mode.

12. The dynamic logic gate of claim 10, wherein said data load ladder comprises a test foot device coupled to said load clock for enabling said logic input ladder when said dynamic logic gate is operated in a test mode.

13. The dynamic logic gate of claim 12, wherein said test foot device is enabled once for a transition from a scan mode to a functional mode.

14. The dynamic logic gate of claim 12, wherein said logic input ladder comprises a functional foot device coupled to a functional logic clock for enabling said logic input ladder when said dynamic logic gate is operated in a functional mode.

15. A method for testing pipelined dynamic logic within an integrated circuit, said method comprising the steps of:

loading a value into a scan latch from a scan chain;

presetting an evaluation node within said dynamic logic;

determining whether or not said integrated circuit is transitioning from scan mode to functional mode; and in response to determining that said integrated circuit is transitioning from scan mode to functional mode, discharging said evaluation node in conformity with said value.

16. The method of claim 15, wherein said step of determining disables a functional logic clock associated with said evaluation node.

17. The method of claim 16, wherein said step of disabling a functional logic clock further disables a logic input ladder.

18. The method of claim 16, wherein said step of discharging is performed by enabling a scan ladder controlled by said value.

19. The method of claim 18, wherein said step of enabling is performed by a load clock for loading values into functional logic from said scan chain.

20. The method of claim 19, wherein said load clock is a scan clock controlling clocking of master latches within said integrated circuit and wherein said scan clock enables said scan ladder.

* * * * *